United States Patent
Vashi et al.

(10) Patent No.: US 6,219,819 B1
(45) Date of Patent: Apr. 17, 2001

(54) METHOD FOR VERIFYING TIMING IN A HARD-WIRED IC DEVICE MODELED FROM AN FPGA

(75) Inventors: Mehul Vashi, Santa Clara; Kiran Buch, Fremont, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/105,549

(22) Filed: Jun. 26, 1998

(51) Int. Cl.[7] .......................... G06F 17/50; H01L 25/00; H03K 19/177
(52) U.S. Cl. .................................. 716/3; 716/16; 716/19; 326/41
(58) Field of Search .................................. 716/3, 16, 19; 326/41

(56) References Cited

U.S. PATENT DOCUMENTS

| | | | |
|---|---|---|---|
| 5,084,824 | 1/1992 | Lam et al. | 364/490 |
| 5,166,556 | * 11/1992 | Hsu et al. | 326/41 |
| 5,182,719 | * 1/1993 | Kuroda et al. | 364/490 |
| 5,267,146 | * 11/1993 | Shimizu et al. | 364/512 |
| 5,300,835 | 4/1994 | Assar et al. | 307/475 |
| 5,394,034 | 2/1995 | Becker et al. | 326/39 |
| 5,452,227 | * 9/1995 | Kelsey et al. | 716/3 |
| 5,465,216 | * 11/1995 | Rotem et al. | 364/488 |
| 5,475,605 | 12/1995 | Lin | 364/488 |
| 5,475,695 | 12/1995 | Caywood et al. | 371/27 |
| 5,493,507 | * 2/1996 | Shinde et al. | 364/489 |
| 5,497,378 | * 3/1996 | Amini et al. | 371/22.3 |
| 5,510,999 | 4/1996 | Lee et al. | 364/491 |
| 5,517,646 | * 5/1996 | Piccirillo et al. | 395/651 |
| 5,526,278 | * 6/1996 | Powell | 716/16 |
| 5,550,839 | 8/1996 | Buch et al. | 371/22.5 |
| 5,563,801 | 10/1996 | Lee et al. | 364/491 |
| 5,572,710 | 11/1996 | Asano et al. | 395/500 |
| 5,572,716 | * 11/1996 | Asano et al. | 395/500 |
| 5,590,049 | 12/1996 | Arora | 364/488 |
| 5,594,657 | * 1/1997 | Cantone et al. | 364/490 |
| 5,754,826 | * 5/1998 | Gamal et al. | 716/19 |

OTHER PUBLICATIONS

"The Programmable Logic Data Book", available from Xilinx, Inc., 2100 Logic Drive, San Jose, CA 95124 1996, pp. 4–47, 4–48, 4–54, 4–80, 4–309, 4–292 through 4–293.
"The Programmable Logic Data Book", (1996), pp. 4–47, 4–48, 4–54, 4–80, 4–309 available from Xilinx, Inc., 2100 Logic Drive, San Jose, California 95124.
"The Programmable Logic Data Book", available from Xilinx,Inc., 2100 LogicDrive, San jose, CA 95124. 1996, pp. 4–47, 4–48, 4–54, 4–80, 4–309, 4–292 through 4–293.
"The XC5200 LCA Family Technical Data Book", Oct. 1995 (referenced as "XC5200TMFPGA Data Sheet") available from Xilinx, Inc. 2100 Lgie Drive, San Jose, Ca.*

* cited by examiner

Primary Examiner—Matthew Smith
Assistant Examiner—Jibreel Speight
(74) Attorney, Agent, or Firm—Michael R. Casey; Edel M. Young

(57) ABSTRACT

A method and system for converting an architecture-specific design of a first type into an architecture-specific design of a second type such that race conditions and other anomalies are detected in the second type. By identifying routing delays in a first architecture and what those same routing delays would be in a second architecture, the method and system verify that a design has been properly converted. The method and system are applicable to the conversion of programmable interconnect logic devices to mask programmable logic devices. For example, a method for verifying timing for a design implemented in a new device when the design is to be moved from an old device. The method is particularly useful for verifying timing in a mask programmable device (HardWire) when the design is being converted from a field programmable device (FPGA). By identifying routing delays of critical paths and paths for which a designer has established requirements, the method efficiently and reliably determines which paths in the new device need to be compared and verified. Reports generated according to the method of the invention greatly simplify the task of assuring a satisfactory conversion.

5 Claims, 8 Drawing Sheets

SAMPLE TIMING REPORT FOR CUSTOMER TIMESPECS

Hardwire Timing Report for <CUSTOMER_NAME-design.lca> XC<4413PQ240>-<4> Design:

Updated:09/12/96

A)

Notes:
* All outputs are assumed to have 50pF load
* All delay numbers are at worst case operating conditions

| Comparison of Customer Specified Timespecs: | LIMIT | FPGA | HARDWIRE |
|---|---|---|---|
| Timespec 'TS01' from grp 'FFS' to group 'FF29MHZ' | 34.0 | 28.7ns | 5.26 |
| Timespec 'TS02' from grp 'FFS' to group 'FF27MHZ' | 34.0 | 38.6ns | 16.95 |
| Timespec 'TS03' from grp 'FFS' to group 'FF4FSC' | 56.0 | 53.0ns | 18.54 |
| Timespec 'TS04' from grp 'FFS' to group 'FFSCLK' | 300.0 | 47.2ns | 18.04 |
| Timespec 'TS05' from grp 'FFS' to group 'FFICLK' | 75.0 | 28.2ns | 13.45 |
| Timespec 'TS06' from grp 'FF29MHZ' to group 'FF29MHZ' | 34.0 | 26.3ns | 14.67 |
| Timespec 'TS07' from grp 'FF27MHZ' to group 'FF27MHZ' | 37.0 | 34.9ns | 16.02 |
| Timespec 'TS08' from grp 'FF4FSC' to group 'FF4FSC' | 56.0 | 53.0ns | 18.54 |
| Timespec 'TS09' from grp 'FFSCLK' to group 'FFSCLK' | 300.0 | 47.2ns | 18.04 |
| Timespec 'TS11' from grp 'FF27MHZ' to group 'FFS' | 37.0 | 34.9ns | 16.02 |
| Timespec 'TS12' from grp 'FF29MHZ' to group 'FFS' | 34.0 | 26.3ns | 14.67 |
| Timespec 'TS13' from grp 'FF4FSC' to group 'FFS' | 56.0 | 53.0ns | 18.54 |
| Timespec 'TS14' from grp 'FFSCLK' to group 'FFS' | 300.0 | 47.2ns | 18.04 |
| Timespec 'TS15' from grp 'FFICLK' to group 'FFS' | 75.0 | 21.5ns | 13.01 |
| Timespec 'TS16' from grp 'KDATI' to group 'KDFF' | "auto". | 13.4ns | 4.27 |
| Timespec 'TS17' from grp 'FCNT_IN' to group 'FCNT_INCLK' | "auto". | 27.0ns | 5.66 |
| Timespec 'TS18' from grp 'KDFF' to group 'KDPADS' | "auto". | 33.3ns | 10.12 |

FIG. 6

METHOD FOR VERIFYING TIMING IN A HARD-WIRED IC DEVICE MODELED FROM AN FPGA

CROSS-REFERENCE TO RELATED APPLICATION

The present invention relates to the following patent applications, all assigned to Xilinx, Inc., assignee of the present application, all of which are incorporated herein by reference:

1. Baxter U.S. patent application Ser. No. 08/634,478 filed Apr. 18, 1996, entitled "Method to Back Annotate Programmable Logic Device Design Files Based on Timing Information of a Target Technology";

2. Baxter, U.S. patent application Ser. No. 08/614,113 filed Mar. 12, 1996 entitled "Method and Apparatus for Converting a Programmable Logic Device Representation of a Circuit into a Second Representation of the Circuit";

3. Baxter, U.S. patent application Ser. No. 08/594,933 filed Jan. 31, 1996 entitled "Configuration Emulation of a Programmable Logic Device";

4. Baxter, U.S. patent application Ser. No. 08/939,744 filed Sep. 29, 1997 entitled "System and Method for Generating Memory Initialization Logic From Programmable Logic Device Parameters";

5. Law et al., U.S. patent application Ser. No. 08/937,809 filed Sep. 29, 1997 entitled "Hardwire Logic Device Emulating an FPGA";

6. Baxter et al., U.S. patent application Ser. No. 08/940,154 filed Sep. 29, 1997 entitled "Programmable I/O Block with Dual Boundary Scan"; and 7. Baxter et al., U.S. patent application Ser. No. 08/939,757 filed Sep. 29, 1997 entitled "Boundary Scan Chain with Dedicated Programmable Routing".

FIELD OF THE INVENTION

The present invention is directed to verifying conversion of an architecture-specific design of a first type into an architecture-specific design of a second type such that race conditions and other anomalies are detected in the second type.

BACKGROUND OF THE INVENTION

Xilinx, Inc. the assignee of the present application, manufactures logic devices. Xilinx produces logic devices with either programmable interconnects (such as pass transistor interconnects) or fixed interconnects made with a mask in the metalization process. A logic device (either mask programmable or with a programmable interconnect) is an integrated circuit chip which includes a plurality of programmable input/output pads and a plurality of configurable logic elements. Each configurable logic element implements a logic function of the "n" inputs to the logic element according to how the logic element has been configured. Logic functions may use all n inputs to the logic element or may use only a subset thereof. A few of the possible logic functions that a logic element can be configured to implement are: AND, OR, XOR, NAND, NOR, XNOR and mixed combinations of these functions. The implementation and operation of logic devices with programmable interconnects made by Xilinx are described in "The Programmable Logic Data Book," pages 4–1 to 4–372, copyright 1996 by Xilinx, available from Xilinx, Inc., 2100 Logic Drive, San Jose, Calif. 95124. The contents of "The Programmable Logic Data Book" are incorporated herein by reference. Since the interconnects are programmable, and often reprogrammable, the programmable interconnect logic devices often are used to prototype a new design which may be changed in the design or debugging phase. A designer selects how signals from I/O blocks and configurable logic elements are to be routed by the programmable interconnect, thereby selecting which signal is applied to which line. The configurability of these programmable interconnect logic devices allows designers to program and test the chips locally without waiting for a mask programmable logic device or an application specific integrated circuit to be manufactured by a foundry. This enhances the designer's productivity.

However, there are many situations where the programmable interconnect logic devices are inappropriate for the final design. For example, when high speed is critical, a mask programmable logic device would likely provide better speed than a configurable one. Further, the non-configurable device is typically cheaper to distribute commercially than its configurable counterpart. In cases such as these, it is important to provide a reliable conversion path from the configurable logic device to a non-configurable equivalent.

Xilinx provides a non-configurable (mask-programmed) hardware device called "HardWire" to which designs for configurable logic devices can be converted. A HardWire device uses the same logic elements placed in the same location as in a customer's original FPGA design, only the routing architecture changes. A description of the HardWire architecture is provided in the HardWire Data Book, published by Xilinx, Inc., the contents of which are incorporated herein by reference. Chapter 2 of the HardWire Data Book is entitled "FPGA Design Considerations for HardWire Designs" and describes some of the issues that are involved in producing a HardWire design from a configurable logic device design. As described above, one of the major changes in using a non-configurable device is a change in speed. Propagation delays from programmable pass transistors used to implement routing in an FPGA are eliminated when pass transistors are replaced by segments in the metalization layers in HardWire. As a result, hidden race conditions latent in the design may appear when converting to HardWire. The increased speed of a HardWire part can also create new problems. Chapter 2 describes setup and hold time requirements and I/O slew rate issues. Increasing the routing speed between logic blocks decreases the amount of time that a signal is kept on a line. Accordingly, it is possible that the HardWire design will no longer meet the hold time requirements, causing errors in the operation of the device or of a system in which the device is placed. Likewise, faster routing can reduce the amount of setup time that is available after a clock pulse. The HardWire Data Book, however, does not describe how to consistently overcome these problems.

SUMMARY OF THE INVENTION

The present invention allows a design implemented in a configurable FPGA to be implemented in a non configurable (HardWire) device without problems due to changes in timing. A reduced engineering effort is required to guarantee that conversion will produce a HardWire device that meets all timing requirements placed on the original configurable FPGA.

According to the invention, timing requirements that were made by the original designer of the configurable FPGA are combined with timing requirements determined from an analysis of critical paths in the configurable FPGA to determine timing requirements that must be met in the HardWire device.

The method of the invention first extracts parameters of the original FPGA device that are important in calculating delays in the HardWire device. These parameters are extracted from a netlist describing the customer's original design and from a speeds file describing path delays in the original FPGA device. They include any delay requirements (maximum or minimum) placed by the customer as well as delays or critical paths determined from analysis of the customer's design. A set of specifications is generated for use in analyzing delays in the HardWire device.

Using libraries of delays for the various HardWire devices and specific data for the particular HardWire device implementing the conversion, the method includes a timing analysis of the original design as implemented in the HardWire device, taking account of any structures that are different from those in the FPGA device, and generates a report (textual or graphic) for indicating to a user what timing problems may exist after the conversion. In one embodiment, the method includes specifying paths to which delay must be added in order to avoid race conditions that (1) were acceptable before conversion and (2) must be made acceptable after conversion.

BRIEF DESCRIPTION OF THE DRAWINGS

The above and further aspects of the present invention will become more clear to those skilled in the art in view of the best presently known mode of carrying out the invention and the industrial applicability of the preferred embodiment as described herein and as illustrated in the several figures, wherein:

FIG. 6 is a table that represents textually the difference between configurable FPGA and HardWire delays for certain signals after conversion to HardWire;

DETAILED DESCRIPTION OF THE DRAWINGS

Figure 1:
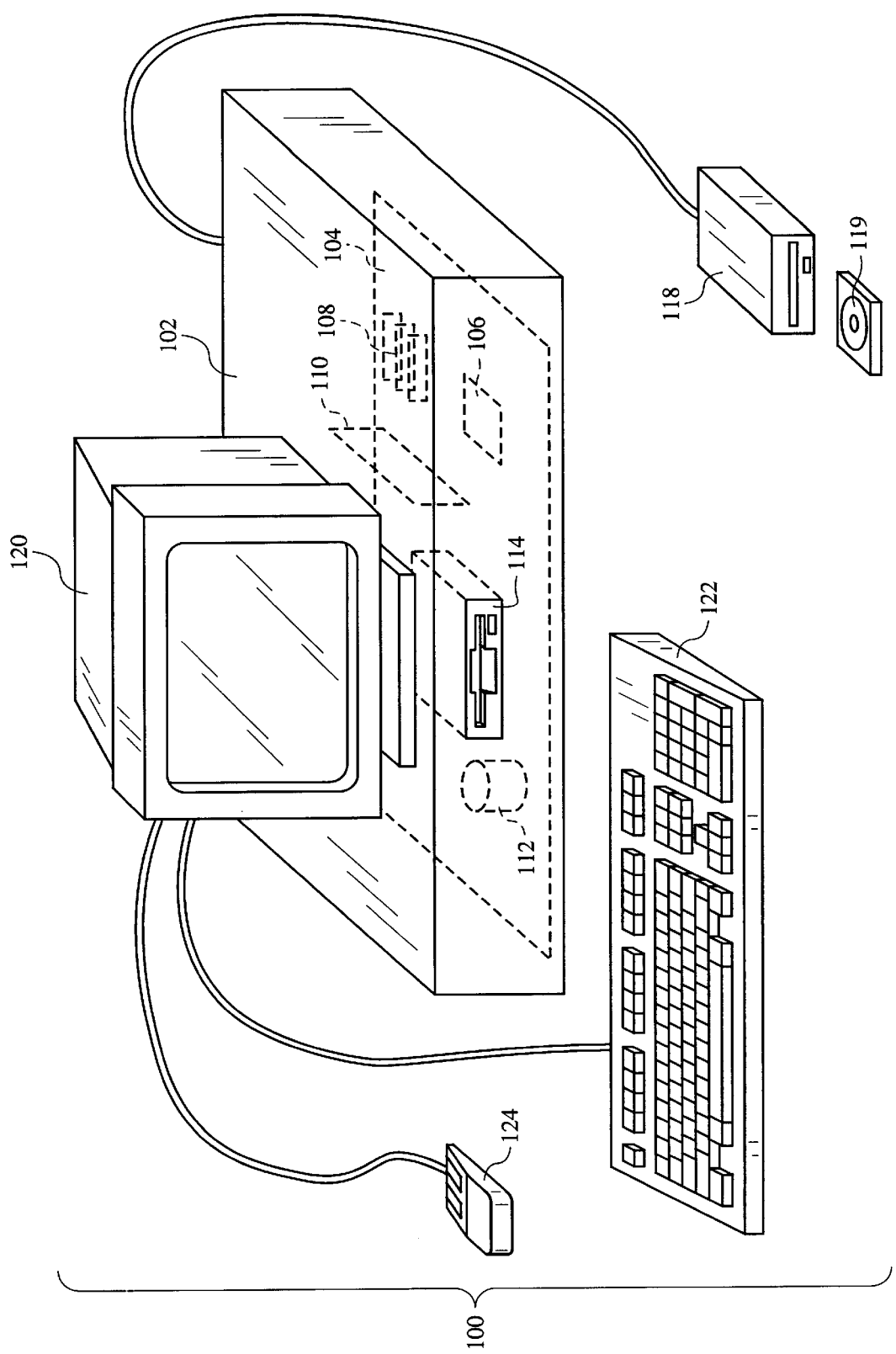
FIG. 1 is a schematic illustration of a computer system for implementing an architectural conversion device according to the present invention.

Referring now to the drawings, wherein like reference numerals designate identical or corresponding parts throughout the several views, FIG. 1 is a schematic illustration of a computer system for converting from an architecture-specific design of a configurable FPGA into an architecture-specific design of a HardWire device such that race conditions and other anomalies are detected in the HardWire device. A computer 100 implements the method of the present invention, wherein the computer housing 102 houses a motherboard 104 which contains a CPU 106, memory 108 (e.g., DRAM, ROM, EPROM, EEPROM, SRAM and Flash RAM), and other optional special purpose logic devices (e.g., ASICs) or configurable logic devices (e.g., GAL and reprogrammable FPGA). The computer 100 also includes plural input devices, (e.g., a keyboard 122 and mouse 124), and a display card 110 for controlling monitor 120. In addition, the computer system 100 further includes a floppy disk drive 114; other removable media devices (e.g., compact disc 119, tape, and removable magneto-optical media (not shown)); and a hard disk 112, or other fixed, high density media drives, connected using an appropriate device bus (e.g., a SCSI bus, an Enhanced IDE bus, or an Ultra DMA bus). Also connected to the same device bus or another device bus, the computer 100 may additionally include a compact disc reader 118, a compact disc reader/writer unit (not shown) or a compact disc jukebox (not shown). Although compact disc 119 is shown in a CD caddy, the compact disc 119 can be inserted directly into CD-ROM drives which do not require caddies. In addition, a printer (not shown) also provides printed listings of reports or charts of the changes in timing between the first and second architectures. The computer 100 may also control a programmer to program an external device such as a programmable gate array. In some programmable gate array architectures, simply writing to a configuration memory in the programmable gate array is sufficient to program it The system includes at least one computer readable medium. Examples of computer readable media are compact discs 119, hard disks 112, floppy disks, tape, magneto-optical disks, PROMs (EPROM, EEPROM, Flash EPROM), DRAM, SRAM, SDRAM, etc. Stored on any one or on a combination of computer readable media, the present invention includes software for controlling both the hardware of the computer 100 and for enabling the computer 100 to interact with a human user. Such software may include, but is not limited to, device drivers, operating systems and user applications, such as design tools. Such computer readable media further include the computer program product of the present invention for converting from one architecture to another. The computer code devices of the present invention can be any interpreted or executable code mechanism, including but not limited to scripts, interpreters, dynamic link libraries, Java classes, and complete executable programs.

Figure 2:
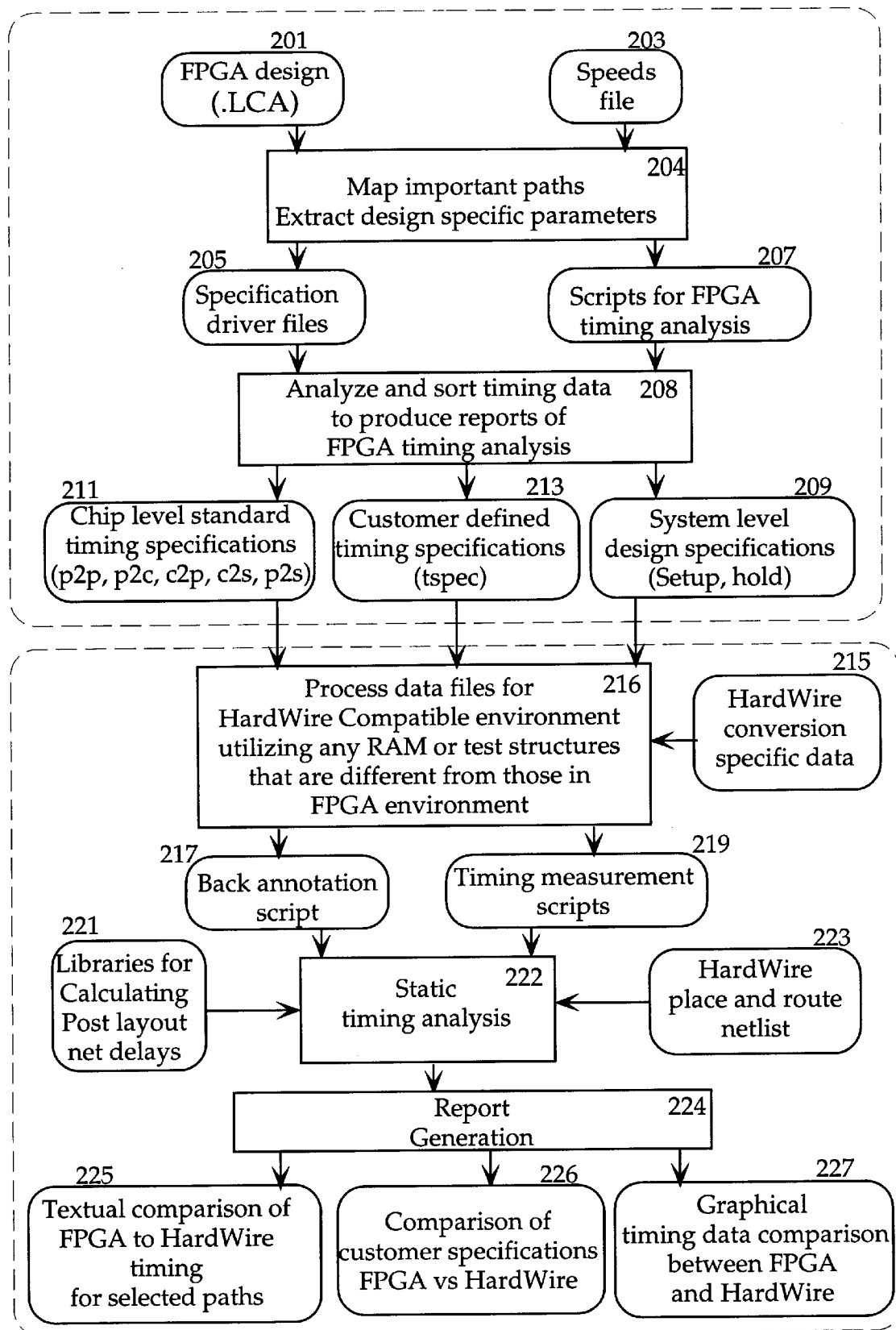
FIG. 2 is a data flow diagram of the overall operation of the present invention.

To implement the present invention, design- and architecture-specific information are analyzed to determine how the change from one architecture to another changes timing in a design. Although the discussion will be described in terms of FPGA and HardWire architectures, the method and system of the present invention may be used when converting between any two architectures. Accordingly, FIG. 2 is a data flow diagram of the overall operation of the present invention. Upon receiving a customer's original FPGA design file 201 (such as an .LCA file) that is to be converted, the present invention determines, either automatically or via user direction, onto which HardWire device (the target device) the design is to be converted and reads speeds file 203. The customer may have designated maximum and minimum delays, and these are included in FPGA design 201. At step 204, the present invention extracts from the original FPGA design file 201 to which signal paths the customer has assigned requirements and determines which paths are critical and must not be slower than the corresponding paths in the configurable FPGA. These important paths are mapped onto paths in the target device. Since FPGA and HardWire designs utilize the same configurable logic blocks (CLBs) placed and routed in the same manner as the original FPGA, these mappings can be readily identified in a new HardWire design Specification driver files 205 and scripts 207 for analyzing whether the HardWire design meets these specification are generated. It may also be necessary to provide speed related information to the analysis program if the same architecture supports various speed ratings (e.g., 25 MHZ versus 35 MHZ).

Having extracted the important paths from the original FPGA design, the present invention determines, either directly or through cooperation with an external program, what the timing delays are for an FPGA design on the specified FPGA architecture. In the presently preferred embodiment, a static timing analysis method is used to identify the (worst-case) delays in the original FPGA design for a given FPGA architecture. When using an external program to perform the static timing analysis, the present invention gathers the identifying information (part type, design file location, etc.) necessary to invoke the external static timing analysis tool which then actually determines the delays of the design for the paths specified by the customer and other paths determined to be critical. One such static timing analysis tool is provided by Synopsys, Inc. of 700 East Middlefield Rd. in Mountain View, Calif., under the trade name PrimeTime.

As a result of the analysis by the static timing analysis tool 208, the delays 211 for the identified paths are stored, in memory or on disk, for later retrieval. The delays are separated by type of path analyzed for later analysis. Important types of signal paths to have analyzed are: pad-to-pad, pad-to-clock, clock-to-pad, clock-to-setup, and pad-to-setup.

Before running a static timing analysis 222 for the HardWire architecture, a pre-analysis phase 216 is used to ensure that the first and second architectures are compatible. Accordingly, during the pre-analysis phase 216, the present invention loads timing delays 211 (pad-to-pad, pad-to-clock, clock-to-pad, clock-to-setup, and pad-to-setup) used in the FPGA analysis and loads the customer-defined specifications 213 as additional requirements for the HardWire design. In addition, any architecture-specific or system requirements 209 (such as setup or hold times) are also loaded. At step 216, the present invention then pre-processes these three types of information along with HardWire conversion specific data 215 to determine whether or not there are structures that are implemented differently in the configurable FPGA and in the HardWire design. One example of such a difference is that some configuration structures from a configurable FPGA design are not included in the HardWire architecture. Another difference is the structure of the RAM cells. Typical Xilinx FPGAs distribute RAM in 16×1 blocks. HardWire devices are smaller and less expensive if RAMs are implemented as larger blocks, i.e., 16×32. However, access is slower, as discussed below.

From this pre-analysis 216 of structural differences between architectures, the present invention can perform a more complete static timing analysis on the HardWire design. If the static timing analysis for the HardWire part is to be performed by an external tool, the present invention generates the commands necessary to start the external tool. In the presently preferred embodiment, a back annotation script 217 and a timing measurement script 219 are produced from the pre-analysis step 216 to be used as two inputs to the external static timing analysis tool 222.

Figure 3:
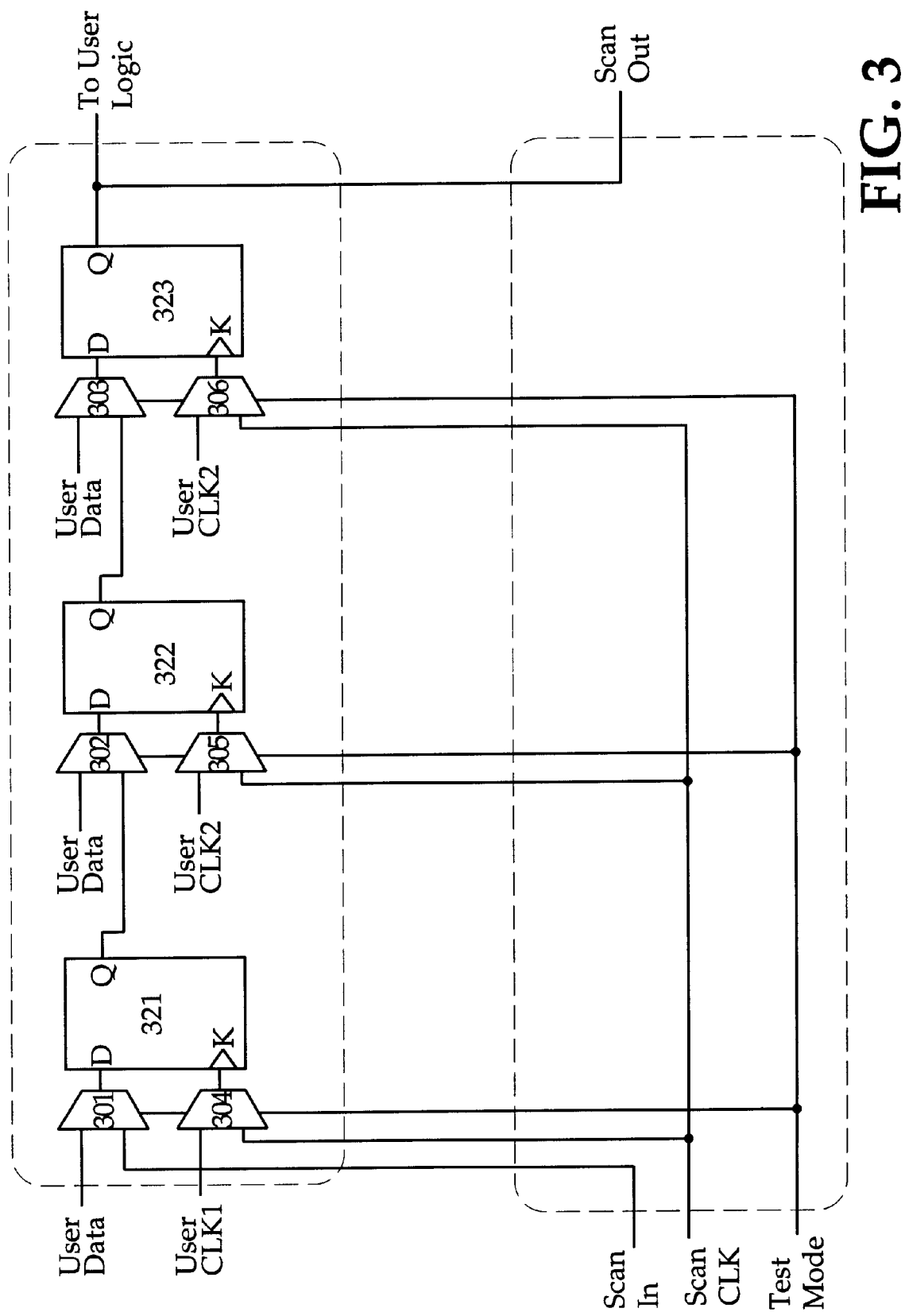
FIG. 3 is a schematic illustration of a first portion of a HardWire architecture to which a configurable FPGA design is to be converted.

The present invention also utilizes back annotation scripts 217 to hide the effects of test circuitry on a customer's design. As shown in FIG. 3, there are paths dedicated to testing, including Scan_In, Scan_CLK, Test_Mode and Scan_Out paths. Circuits such as shown in FIG. 3 are present at multiple points in both the FPGA and HardWire devices (see FIGS. 4 and 5) but are used only for testing the devices, not for normal operation. Therefore, they should be bypassed during timing analysis of the HardWire device. To bypass these paths for static timing analysis, the Scan_In, Scan_CLK, and Test_Mode signals are set to an appropriate logic level, such as a "1" logic level. As a result, for timing purposes, multiplexers 301–306 are controlled to always route the user data and clock signals and to never route the test signals. Likewise, the Scan_Out signal is effectively removed by identifying its corresponding pin as being unconnected. Consequently, in relation to the customer's design, the test circuitry is considered to be extraneous circuitry for static timing purposes. It is also possible to instruct the timing analysis tool 222 to ignore certain signals paths since they are unimportant. Using the Synopsys static timing tool, lines can be so designated by using the "disable_timing" command in conjunction with the name of the path to be ignored.

Figure 4:
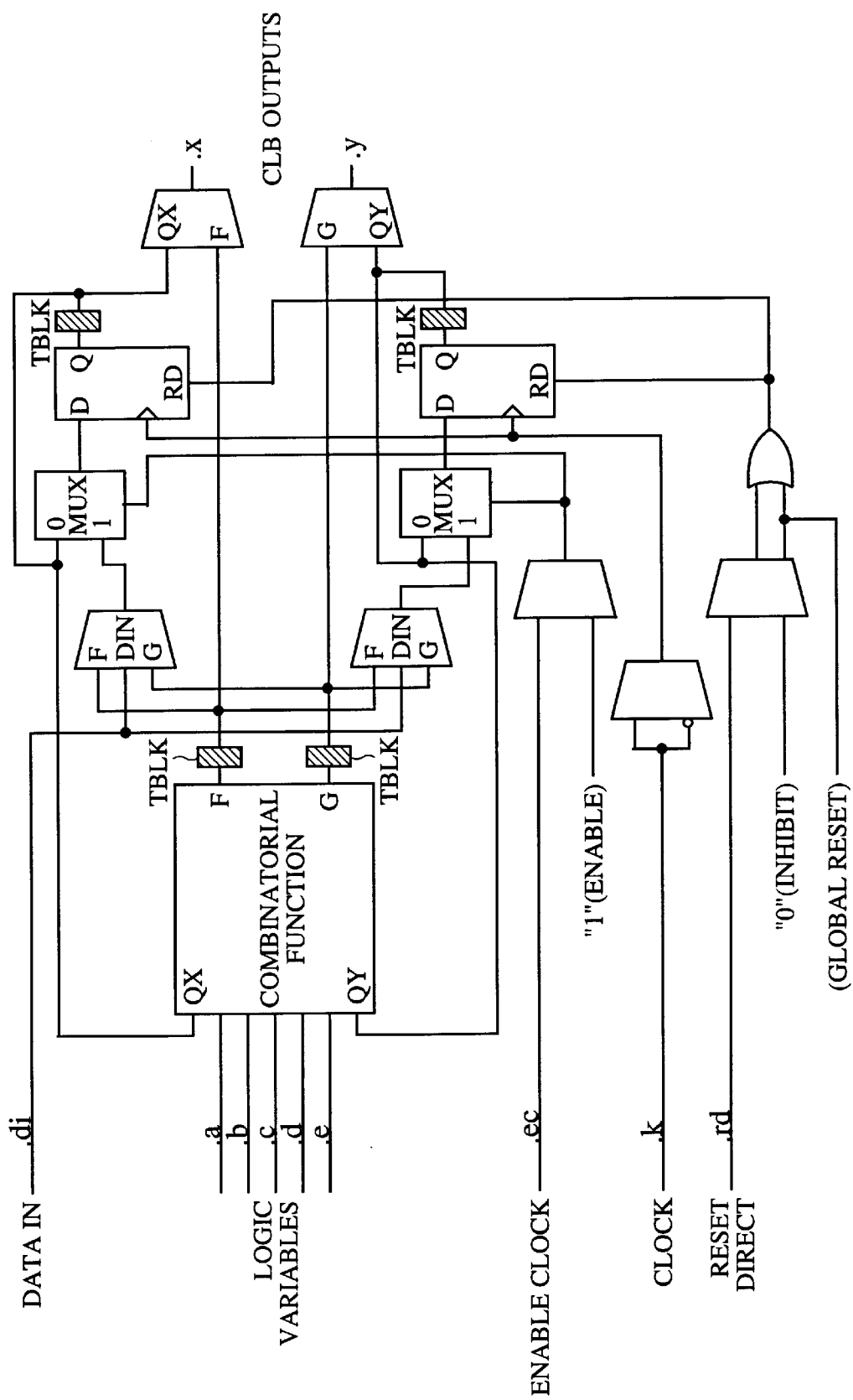
FIG. 4 is a schematic illustration of a second portion of the HardWire architecture to which a configurable FPGA design is to be converted.
Figure 5:
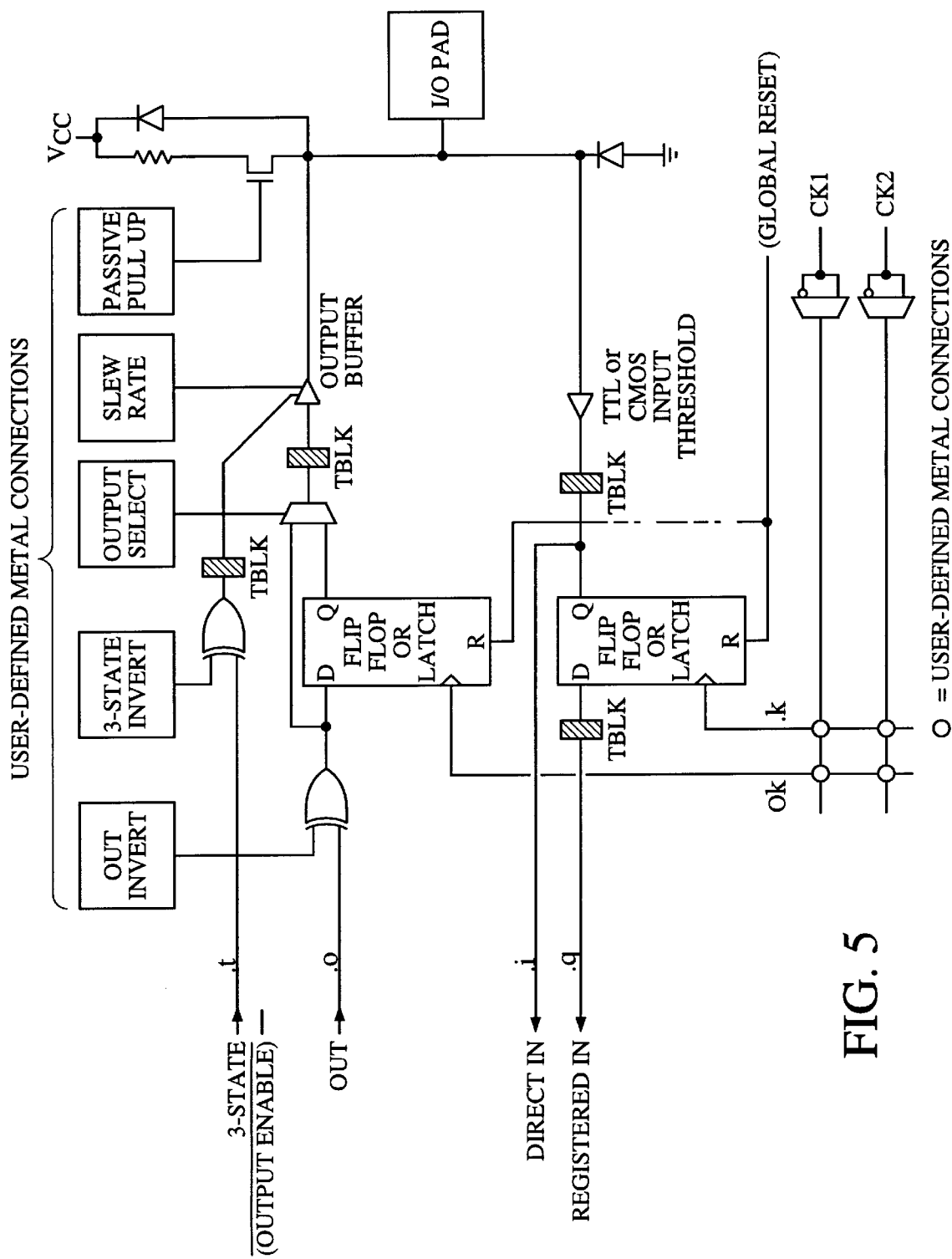
FIG. 5 is a schematic illustration of an IOB portion of the HardWire architecture to which an FPGA design is to be converted.

As shown in FIGS. 4 and 5, the HardWire architecture includes test circuitry, (TBLK) which is not part of the customer's design. The test circuitry may be formed as shown in FIG. 3. To avoid having this circuitry contribute to the overall timing delays calculated, the back annotation script also bypasses the TBLK circuitry by specifying that multiplexers 301–306 should route user signals to the flip-flops 321–323 and then to the selected user logic rather than routing the Scan_In signal to either user logic or Scan_Out. In addition, to avoid calculating artificially long delays, each I/O block (shown in FIG. 5) is considered to be either an input or an output, but not both. This is necessary, since it is possible that the static timing analysis would calculate a signal routing delay assuming that a signal is routed into an I/O block, makes a U-turn in the I/O block, and is then routed out of the I/O block. This would add to the delay but not advance the routing process any. To avoid this clearly sub-optimal path, when an I/O block is configured to be an input, the unused output is identified as a "false path" or a path from which no signals actually are used. In the back annotation script for Synopsys, this is achieved by utilizing the "set_false_path" command, but an equivalent command can be used for another static analysis timing tool.

The back annotation and timing measurements scripts 217 and 219 produced in pre-analysis phase 216 are input to the static timing analysis tool 222. Scripts 217 and 219 include both the FPGA timing information from specifications 211, 213, and 209 as well as corresponding information for the HardWire device to which the design is being converted. In addition to scripts 217 and 219, a netlist 223 derived from the netlist of the original FPGA design 201 indicates to static timing analysis tool 222 how the paths are to be connected in the HardWire device. Also, libraries 221 of wiring segment delays for the HardWire device are used to calculate post layout net delays of the paths as they are to be connected in the HardWire device. From this information, static timing analysis tool 222 calculates HardWire specifications corresponding to the FPGA specifications 211, 213, and 209. A report generation step 224 compares the HardWire specifications to FPGA specifications 211, 213, and 209, and may generate several kinds of reports. A textual comparison 225 of FPGA to HardWire timing for selected paths is available. Similarly, a textual report 226 shows comparison of customer specifications (entered when the original FPGA design was implemented) to timing for the respective paths in the HardWire device. An example of such a comparison is shown in FIG. 7.

Figure 7:
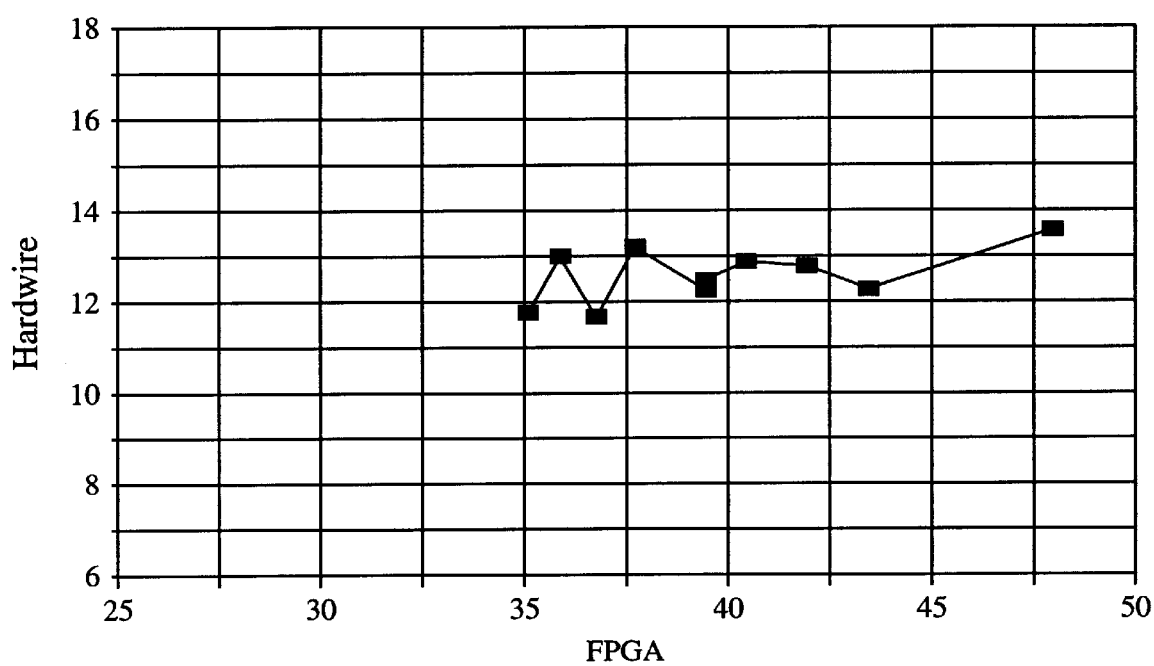
FIG. 7 is a graph that represents graphically the difference between configurable FPGA and HardWire delays for pad-to-pad signals after conversion to HardWire.

In the example of FIG. 7, no timing path in the HardWire device became slower than the corresponding path in the FPGA device. This provides a relatively reliable indication that no timing problems were introduced by the conversion, at least for the paths listed. It is possible, however, that other timing problems were introduced. If distributed RAMs in an FPGA have been replaced by one larger RAM in the HardWire device, RAM access will be slower. To avoid a timing problems from such a conversion, the slower paths must be examined to ensure that they meet required timings. If a report indicates that certain paths have increased delay, an engineer will know of the potential problems before conversion is implemented, and can modify the conversion if necessary before implementing the design in the HardWire device.

In reports 225–227, delays are preferably broken down into types of delay (one pad-to-pad report, one pad-to-clock report, etc.). Having separated the delays into these groups, problems can be more readily identified based on known conversion issues. For example, by grouping all the pad-to-setup delays, the software or a customer can quickly identify whether or not a signal in a HardWire design has sufficient time to set up. As an illustration, if a path had a delay of 40ns in the FPGA device but a delay of 3ns in the HardWire device, the logic element that is fed by the path may no longer meet a required setup time of 4ns. A report will indicate this shortcoming. The process can be used for both minimum and maximum delay issues.

Figure 8:
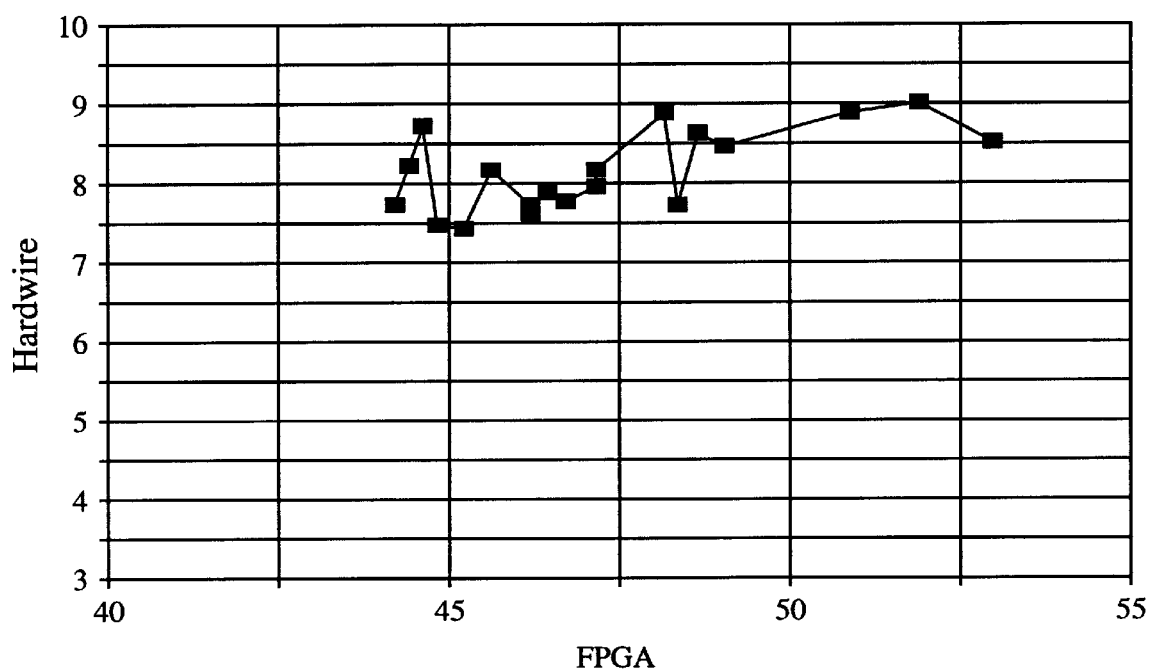
FIG. 8 is a graph that represents graphically the difference between configurable FPGA and HardWire delays for certain clock-to-setup signals after conversion to HardWire.

Sometimes graphical reports are easier for a person to comprehend. Report 227 generated by the report generation step 224 (shown in FIG. 2) is a graphical timing comparison. FIGS. 7 and 8 illustrate such reports. FIG. 7 illustrated the comparison of pad-to-pad delays and FIG. 8 illustrates the comparison of clock-to-setup delays. On such graphs, a diagonal line can be drawn to imagined to indicate equal delays for the FPGA and HardWire devices. If all paths of interest give points on the graph on the side of the diagonal indicating that the HardWire device is faster, then a synchronous design will have no timing problems.

Ideally, all points on the graph of FIG. 7 or 8 should lie close to a single line having a slope less than 1. That is, all paths should have approximately equal proportional decrease in delay. In synchronous designs, closeness to a line having a slope less than 1 is not critical. However, some designs include asynchronous portions with race conditions, in which two signals must pass through different stings of combinatorial gates and one signal must reach an element before the other in order to produce a correct output. The design will have worked properly in the configurable FPGA but, because of differently reduced delays, may not work properly in a HardWire device. If paths with race conditions have been identified at step 204, problems with race conditions will show up in one of reports 225 and 227. In response to such a report, delay elements can be added to selected paths in the HardWire conversion (as discussed by Baxter in U.S. patent application Ser. No. 08/614,113) in order to overcome the race condition problems, after which the timing analysis method of FIG. 2 can be repreated to assure a successful conversion.

The above are only some examples of available embodiments of the present invention. Those skilled in the art will readily observe that numerous other modification and alterations may be made without departing from the spirit and scope of the invention. Accordingly, the above disclosure is not intended as limiting and the appended claims are to be interpreted as encompassing the entire scope of the invention.

What is claimed is:

1. A computer program product, comprising:
   a computer storage medium and a computer program code mechanism embedded in the computer storage medium for causing a computer to convert a first logic design layout into compatible second logic design layout, the computer program code mechanism comprising:
   a first computer code device configured to determine a timing characteristic in a first logic design layout for a first logic device architecture;
   a second computer code device configured to determine the timing characteristic in a second logic design layout for a second logic device architecture; and
   a third computer code device configured to compare the timing characteristics of the first and second logic design layouts of the first and second logic device architectures to determine if the first and second logic design layouts can be interchanged compatibly;
   wherein the first and second logic device architectures both comprise configurable logic blocks which are configured substantially identically but wherein a first routing architecture of the first logic device architecture comprises a reconfigurable routing architecture and a second routing architecture of the second logic device architecture comprises a fixed routing architecture using a customer masked metalization layer having equivalent paths to those established by the reconfigurable routing architecture.

2. The computer program product as claimed in claim 1, wherein the timing characteristic is routing delay.

3. The computer program product as claimed in claim 1, further comprising:
   a fourth computer code device configured to remove an effect of extraneous circuitry from the second logic design layout.

4. The computer program product as claimed in claim 1, wherein the first and second logic device architectures are substantially equivalent except for their corresponding routing architectures.

5. The computer program product as claimed in claim 1, wherein the first and second logic device architectures both comprise configurable logic blocks which are configured substantially identically but which comprise routing architectures that differ.

* * * * *